US007183872B2

(12) United States Patent
Lee et al.

(10) Patent No.: US 7,183,872 B2
(45) Date of Patent: Feb. 27, 2007

(54) LAMINATED BALUN TRANSFORMER

(75) Inventors: Byoung Hwa Lee, Sungnam (KR); Dong Seok Park, Seoul (KR); Min Cheol Park, Kyungki-do (KR); Sang Soo Park, Kyungki-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 51 days.

(21) Appl. No.: 11/065,232

(22) Filed: Feb. 24, 2005

(65) Prior Publication Data

US 2006/0061429 A1 Mar. 23, 2006

(30) Foreign Application Priority Data

Sep. 23, 2004 (KR) ..................... 10-2004-0076301

(51) Int. Cl.
*H03H 7/42* (2006.01)
*H01F 5/00* (2006.01)

(52) U.S. Cl. .......................... 333/26; 333/25; 336/200

(58) Field of Classification Search .................. 333/25, 333/26; 336/200
See application file for complete search history.

(56) References Cited

U.S. PATENT DOCUMENTS 6,483,415 B1 * 11/2002 Tang .......................... 336/200
6,768,410 B1 7/2004 Yazaki et al. ............... 336/200
6,954,116 B2 * 10/2005 Nosaka ........................ 333/26

* cited by examiner

*Primary Examiner*—Dean Takaoka
(74) *Attorney, Agent, or Firm*—Volpe and Koenig, PC

(57) ABSTRACT

A laminated balun transformer subminiaturized with a transmission line length reduced below λ/4 without any variation of characteristics. The laminated balun transformer includes a first strip line having one end inputted to a unbalanced signal; a second strip line having connected to the first strip line; a third strip line formed in parallel with the first strip line and connected to a ground and connected to the external electrode for a first balanced signal; a fourth strip line formed in parallel with the second strip line and connected to the external electrode for a ground and the external electrode for a second balanced signal; and a capacitance forming electrode formed in parallel with a portion of the opened end of the second strip line and connected to the external electrode for the unbalanced signal.

9 Claims, 5 Drawing Sheets

LAMINATED BALUN TRANSFORMER

RELATED APPLICATION

The present invention is based on, and claims priority from, Korean Application Number 2004-76301, filed Sep. 23, 2004, the disclosure of which is incorporated by reference herein in its entirety.

BACKGROUND OF THE INVENTION

1. Field of the Invention

The present invention relates to a laminated balun transformer, and more particularly, to a laminated balun transformer subminiaturized with a transmission line length reduced below λ/4 without any variation of characteristics.

2. Description of the Related Art

A term "balun" in a balun transformer, which is the abbreviation for balance to unbalance, refers to a device composed of a circuit or structure for transforming a balanced signal to an unbalanced signal and vice versa. For example, this is required to perform a transformation between the balanced signal and the unbalanced signal when a device having a balanced input/output stage, such as a mixer and an amplifier, is connected to a device having an unbalanced input/output stage, such as an antenna.

The balun transformer can be implemented by a combination of lumped elements such as R, L, and C elements, or distributed elements such as a microstrip line, a strip line and a transmission line. Recently, with an increasing need for miniaturization of radio communication products widely employing the balun transformer, a laminated balun transformer using low temperature cofired ceramics (LTCC) is being frequently used to reduce the size of the elements.

FIG. 1 is an equivalent circuit showing a basic configuration of a general balun transformer suggested by Marchand. As shown in this figure, the balun transformer is composed of four strip lines 14 to 17 each having a length of λ/4 (where, λ is 1/fc (fc is a center frequency of an input/output signal)). Of the four strip lines 14 and. 17, a first strip line 14 has one end connected to an unbalanced port 11 through which an unbalanced signal having a certain frequency is inputted or outputted. A second strip line 15 has one end connected in series to the other end of the first strip line 14. The other end of the second strip line 15 is opened. In addition, a third strip line 16 and a fourth strip line 17 have respective one ends connected to a ground point and are arranged in parallel with the first strip line 14 and the second strip line 15, respectively, to form an electrical coupling between them. The other ends of the third and fourth strip lines 16 and 17 are connected respectively to balanced ports 12 and 13 through which a balance signal is inputted or outputted.

In the above configuration, the first strip line 14 and the third strip line 16 form an coupler and the second strip line 15 and the fourth strip line 17 form another coupler. With the above configuration, when the unbalanced signal having the certain frequency is inputted to the unbalanced port 11, an electromagnetic coupling among the first to fourth strip lines 14 to 17 is generated, and accordingly, the balanced signal having the same frequency and magnitude as the inputted unbalanced signal and but having a phase, which is different by 180 degrees from a phase of the unbalanced signal, is outputted through the balanced ports 12 and 13. On the contrary, when two balanced signals having different frequencies, the same magnitude, and phases, which are different by 180 degrees from each other, are respectively inputted to the balanced ports 12 and 13, an unbalanced signal having the same frequency as the two inputted balanced signals are outputted through the unbalanced port 11.

A conventional laminated balun transformer having such an equivalent circuit has a shape as shown in FIG. 2 and an internal structure as shown in FIG. 3.

Referring to FIG. 2, the conventional laminated balun transformer 20 is composed of a rectangular hexahedral dielectric block 21 and a plurality of external electrodes 23 to 28 formed on two opposite sides of the dielectric block 21, each of which is set as a terminal such as an unbalanced terminal, a balanced terminal, or a ground terminal. For example, an external electrode 3 is set as a terminal for non-connection, external electrodes 24 and 27 are set as a terminal for a ground, external electrodes 25 and 28 are set as a terminal for input/output of a balanced signal, and an external electrode 26 is set as a terminal for input/output of an unbalanced signal.

Referring to FIG. 3, the dielectric block 21 is composed of a plurality of dielectric sheets laminated using an LTCC method. On the plurality of dielectric sheets laminated are formed a first ground electrode 31*a* connected to the external electrodes 24 and 27 for a ground, the first strip line 14 having a length of λ/4 and having one end connected to the external electrode 26 for input/output of the unbalanced signal, the third strip line 16 formed in parallel with the first strip line 14, having a length of λ/4 and having both ends connected respectively to the external electrode 25 for input/output of the balanced signal and the external electrode 27 for a ground, a second ground electrode 31*b* connected to the external electrodes 24 and 27 for a ground, the second strip line 15 having a length of λ/4 and having one end connected to the first strip line 14 via the external electrode 23 and the other end opened, the fourth strip line 17 formed in parallel with the second strip line 15 and having both ends connected respectively to the external electrode 27 for a ground and the external electrode 28 for input/output of the balanced signal, and a third ground electrode 31*c* connected to the external electrodes 24 and 27 for a ground, sequentially in a downward direction.

Additionally, on the plurality of dielectric sheets laminated may be formed lead electrodes 32*a* to 32*d* for connecting the first to fourth strip lines 14 to 17 to respective external electrodes 23 to 28, and via holes 33*a* to 33*d* for electrically connecting the lead electrodes 32*a* to 32*d* to corresponding strip lines 14 to 17 on other layers.

As described above, the laminated balun transformer is miniaturized by vertically laminating four λ/4 strip lines. However, there is a limitation to the miniaturization of the laminated balun transformer due to an area required to implement the λ/4 strip lines.

SUMMARY OF THE INVENTION

Therefore, the present invention has been made in order to overcome such a limitation to the miniaturization, and it is an object of the present invention to provide a laminated balun transformer subminiaturized with a transmission line length reduced below λ/4 without any variation of characteristics.

In accordance with an aspect of the present invention, the above and other objects can be accomplished by the provision of a laminated balun transformer including a dielectric block formed by laminating a plurality of dielectric sheets, and a plurality of external electrodes formed on the outer sides of the dielectric block, the plurality of external electrodes being used for a ground, input/output of an unbalanced signal, input/output of first and second balanced signals, and non-connection, wherein inside the dielectric block are laminated a first strip line having one end connected to the external electrode for input/output of the unbalanced signal; a second strip line having one end connected to the other end of the first strip line, the other end of the second strip line being opened; a third strip line formed in parallel with the first strip line, one end of the third strip line being connected to the external electrode for a ground and the other end of the third strip line being connected to the external electrode for input/output of the first balanced signal; a fourth strip line formed in parallel with the second strip line, one end of the fourth strip line being connected to the external electrode for a ground and the other end of the fourth strip line being connected to the external electrode for input/output of the second balanced signal; and a capacitance forming electrode formed in parallel with a portion of the other opened end of the second strip line and having one end connected to the external electrode for input/output of the unbalanced signal for forming a capacitance in parallel with the first and second strip lines.

Preferably, when the operation frequency of the balun transformer is fc, each of the first to fourth strip lines has a length less than λ/4 (where, λ is 1/fc).

Preferably, the first strip line is formed on the same plane as the second strip line, and the third strip line and the fourth strip line are formed on the same plane under or above the first and second strip lines.

Preferably, the capacitance forming electrode is formed on the same plane as the second strip line.

Preferably, the capacitance forming electrode is formed on the top or the bottom of the second strip line.

Preferably, ground electrodes connected to the external electrode for a ground for forming an electrical shielding from the outside are further formed on the uppermost and lowermost layers of the dielectric block, respectively.

Preferably, the first to fourth strip lines have a spiral or meandering shape.

Preferably, the first to fourth strip lines are formed on different planes. In this case, the dielectric block further includes a ground electrode connected to the external electrode for a ground for forming an electrical shielding between the first and third strip lines and the second and fourth strip lines in parallel with each other.

Preferably, the first and second strip lines are connected to each other through the external electrode for non-connection. In this case, the dielectric block further includes a plurality of lead electrodes, each being connected to the first and second strip lines through a via hole, for connecting the first and second strip lines to the external electrode for non-connection. At this time, the capacitance forming electrode is formed on the same plane as the lead electrodes such that the number of laminations is not further increased.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, preferred embodiments of the present invention will be described in detail with reference to the accompanying drawings. In the description and the drawings, illustrations of elements having no relation with the present invention are omitted in order to prevent the subject matter of the present invention from being unclear.

Figure 4:
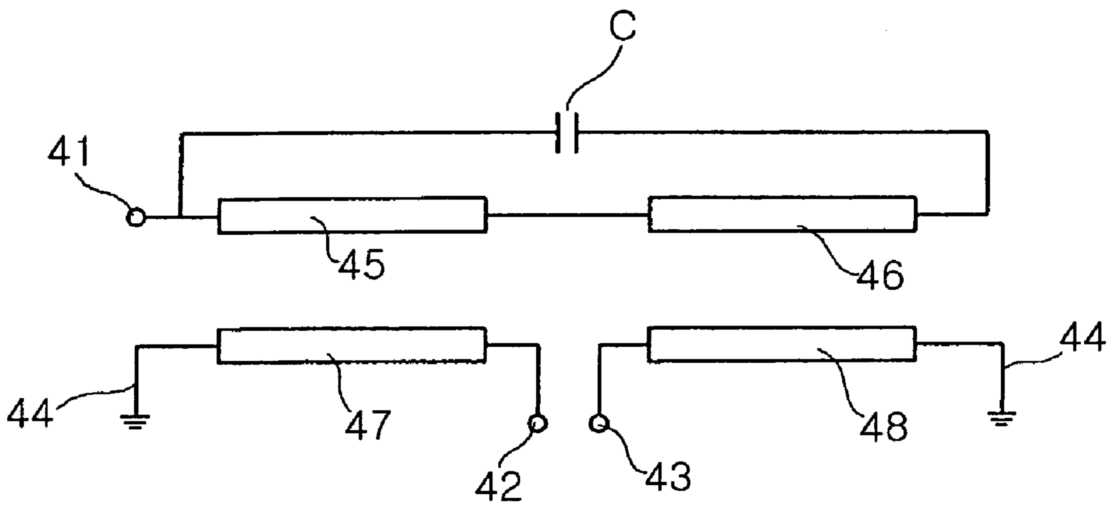
FIG. 4 is an equivalent circuit of a balun transformer according to the present invention.

FIG. 4 is an equivalent circuit of a balun transformer according to the present invention.

Referring to FIG. 4, a balun transformer according to the present invention includes a unbalanced port 41 through which an unbalanced signal having a certain frequency is inputted/outputted, a first strip line 45 having one end connected to the unbalanced port 41, a second strip line 46 having one end connected to the other end of the first strip line 45 and the other end opened, a capacitor C formed in parallel with the first strip line 45 and the second strip line 46, a third strip line 47 arranged in parallel with the first strip line 45 and having one end grounded, a fourth strip line 48 arranged in parallel with the second strip line 46 and having one end grounded, and first and second balanced ports 42 and 43 connected respectively to the other ends of the third and fourth strip lines 48 and 48 and through which balanced signals having the same frequency and magnitude as the unbalanced signal and having a phase, which is different by 180 degrees from a phase of the unbalanced signal, are inputted/outputted.

Here, the first to fourth strip lines 45 to 48 are implemented with a length shorter than λ/4, where a center wavelength of the inputted/outputted balanced or unbalanced signals is λ.

The capacitor C is connected in parallel with the first and second strip lines 45 and 46 to form an LC resonator. Accordingly, the operation frequency of the balun transformer is determined by the resonance frequency of the LC resonator. Here, the operation frequency is in inverse proportion to the product of a capacitance of the capacitor C by an inductance L determined by the first and second strip lines 45 to 48. Namely, assuming that the lengths of the first to fourth strip lines 45 to 48 are fixed, the operation frequency of the balun transformer becomes lowered as the capacitance C becomes large. When this is inversely applied, by providing the capacitor C, the balun transformer having a certain operation frequency (f=1/λ) can be implemented by the first to fourth strip lines having a length less than λ/4.

Figure 1:
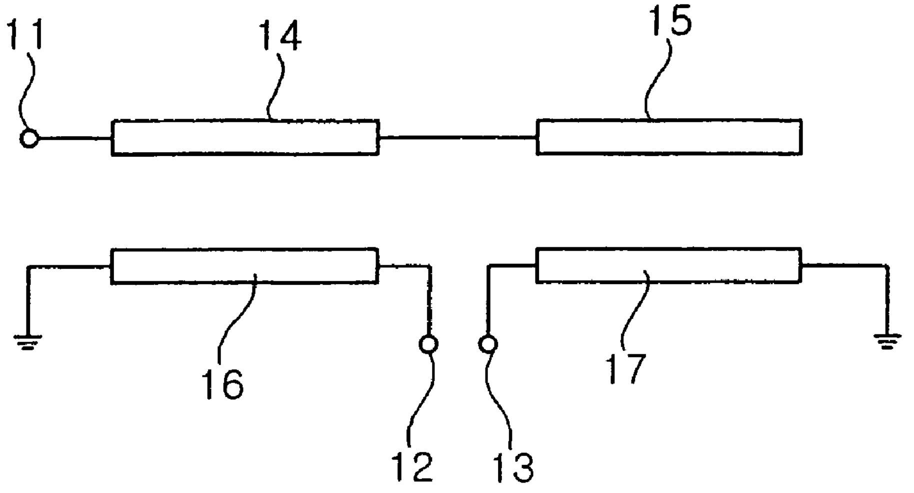
Prior art FIG. 1
FIG. 1 is an equivalent circuit of a general balun transformer.
Figure 2:
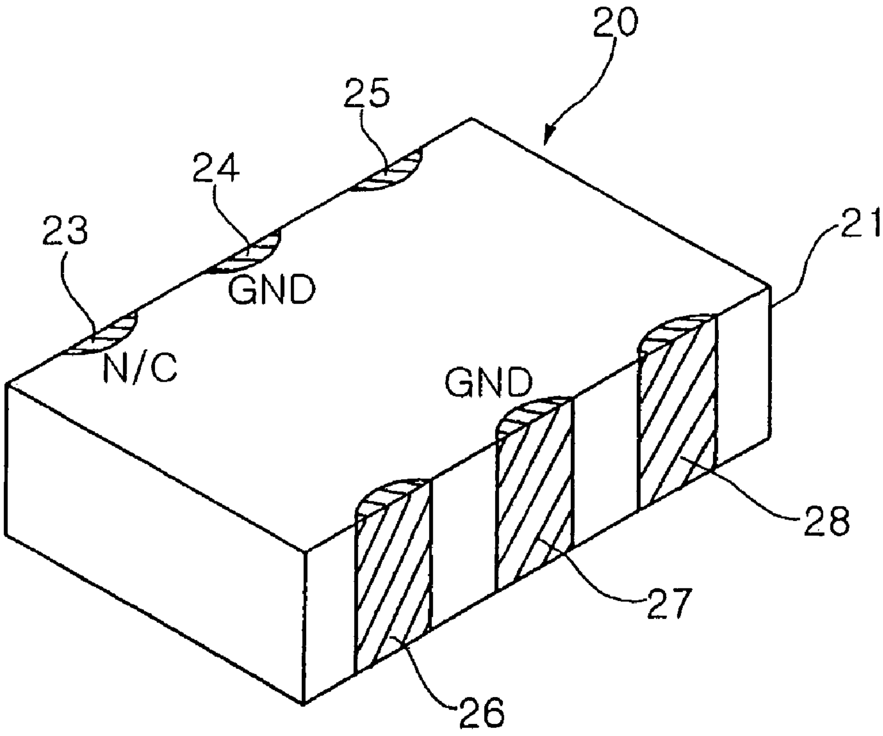
Prior art FIG. 2
FIG. 2 is a perspective view showing a shape of a conventional laminated balun transformer.
Figure 3:
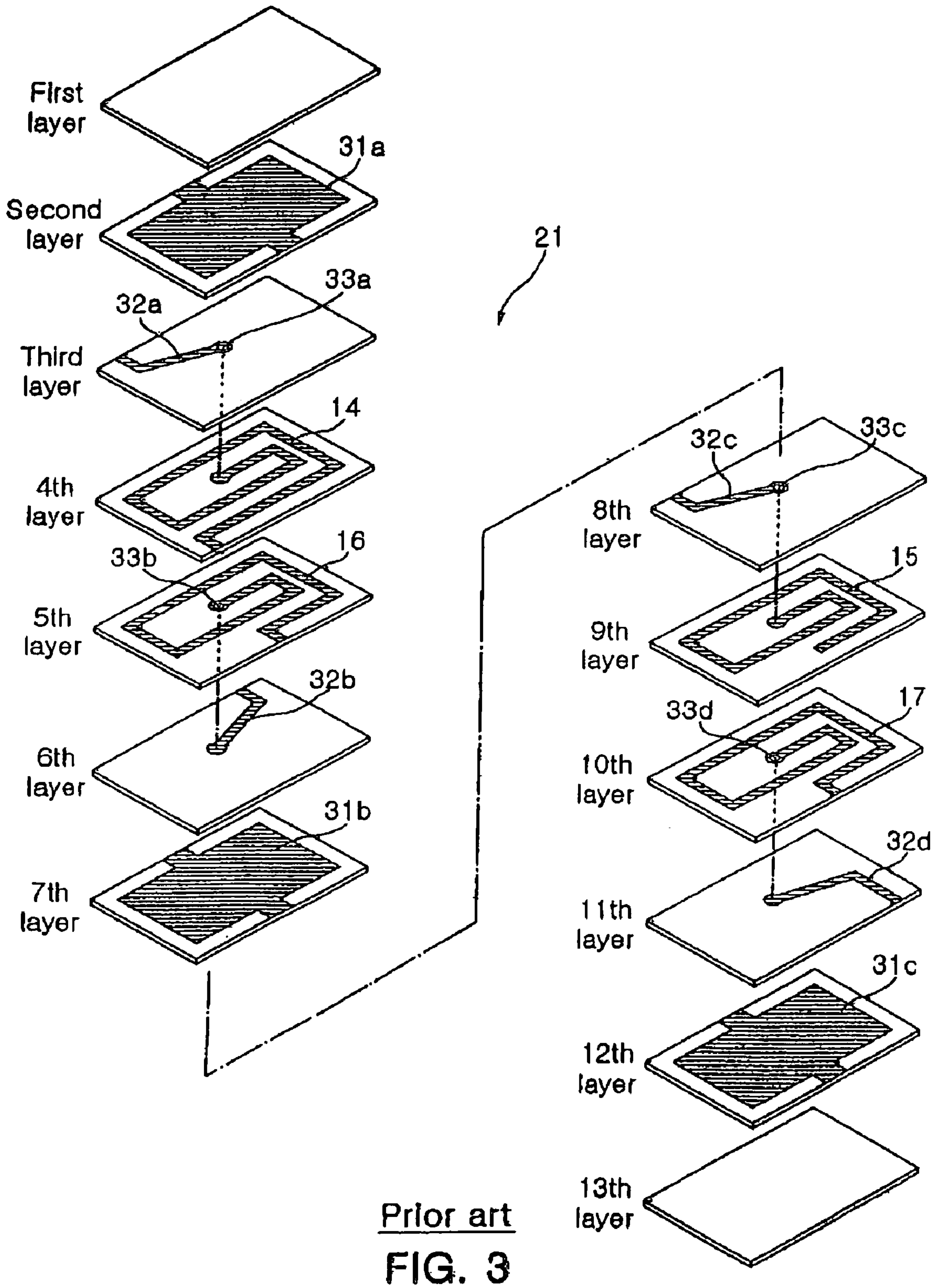
Prior art FIG. 3
FIG. 3 is an exploded perspective view illustrating an internal structure of the conventional laminated balun transformer of FIG. 2.

Accordingly, the balun transformer of the present invention as shown in FIG. 4 can have the four strip lines having the reduced length, compared to the conventional balun transformer having the same operation frequency and the structure as shown in FIG. 1. As a result, the size of the balun transformer can be further reduced.

Figure 5:
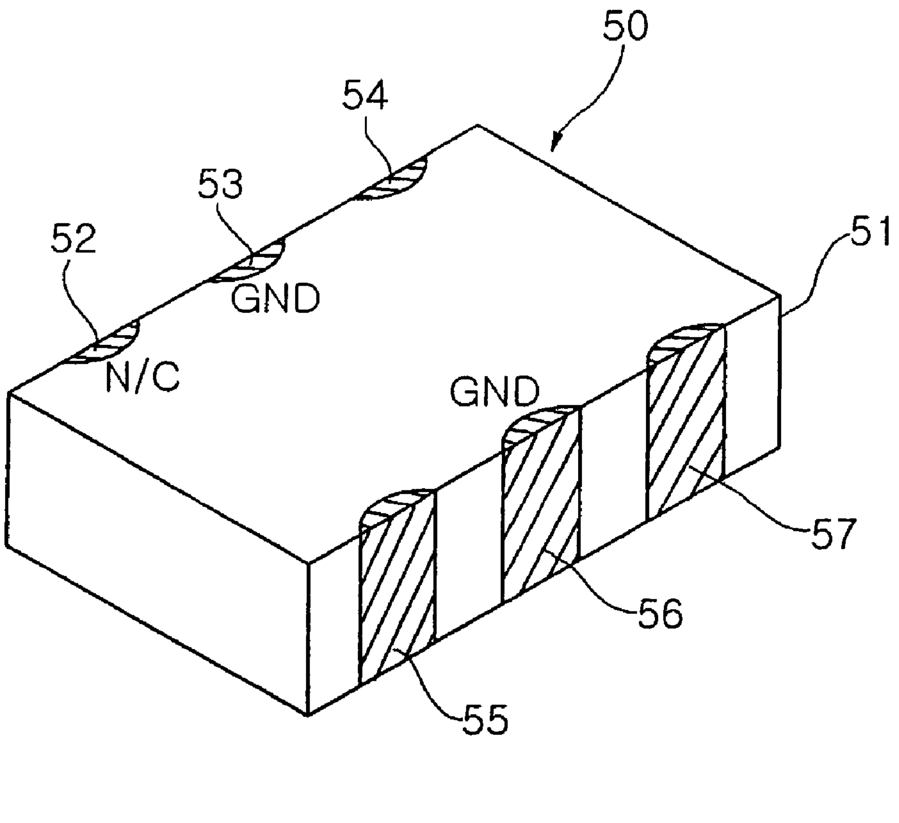
FIG. 5 is a perspective view showing a shape of a laminated balun transformer according to the present invention.
Figure 6:
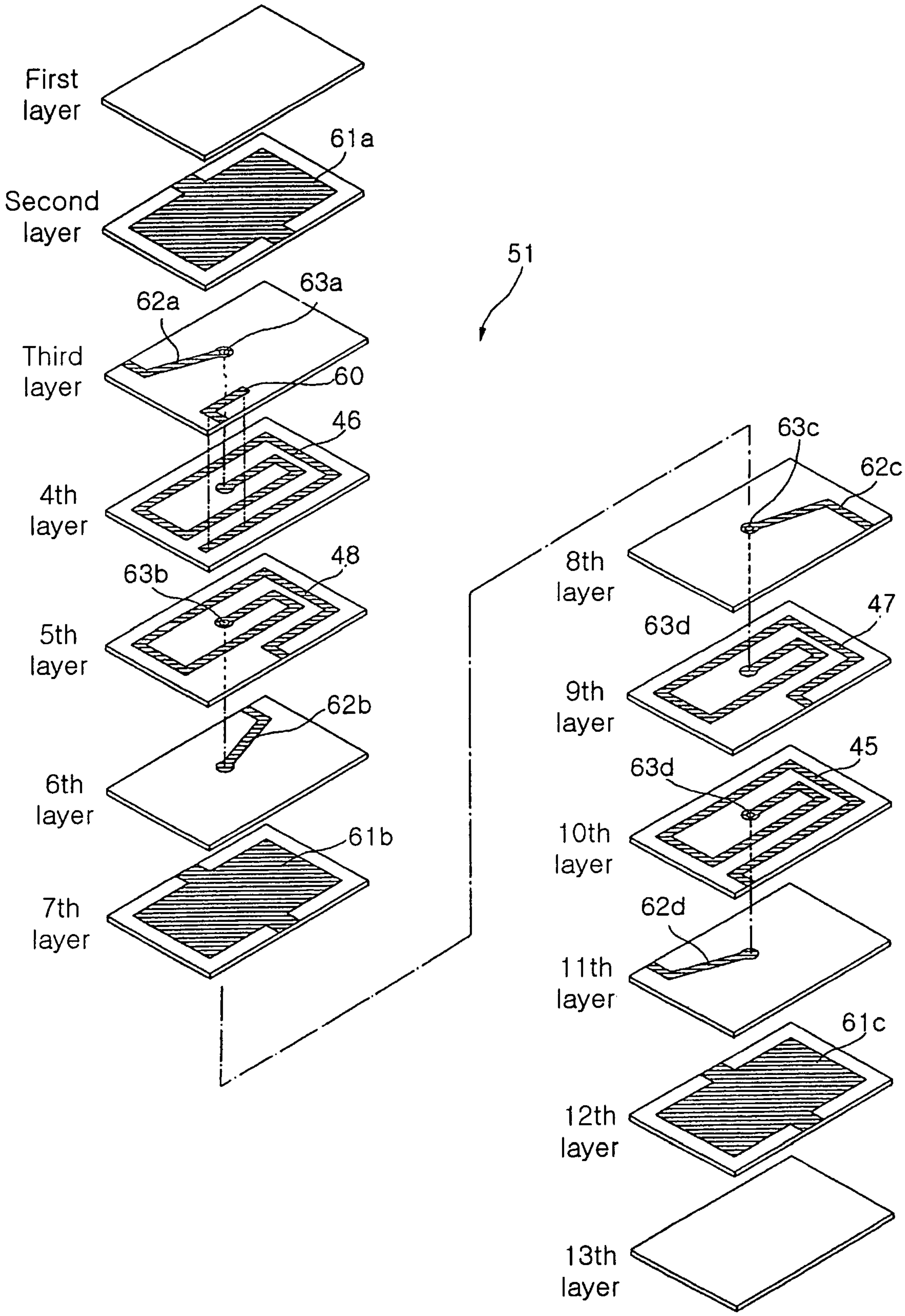
FIG. 6 is an exploded perspective view illustrating an internal structure of a laminated balun transformer according to the present invention.
Figure 7:
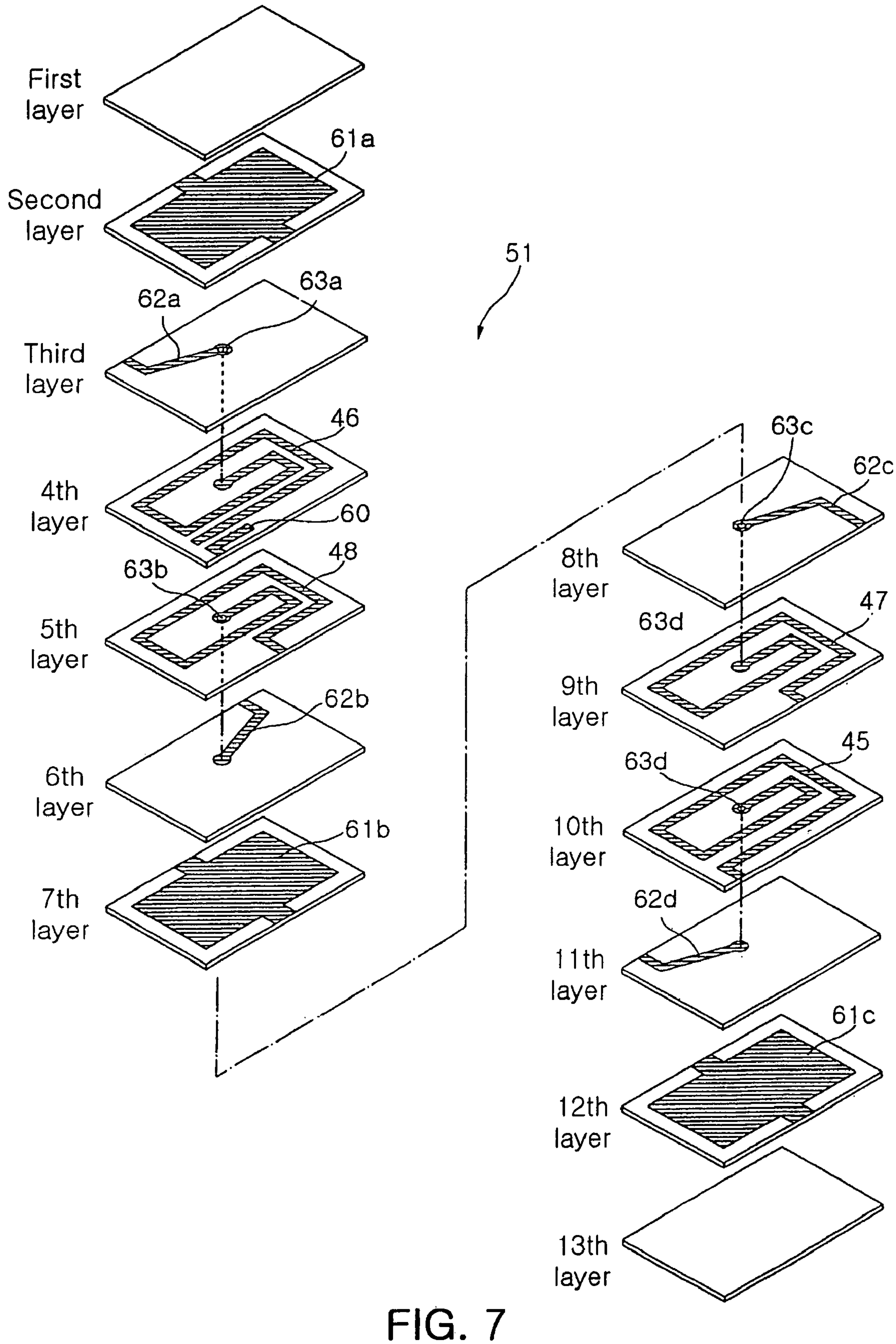
FIG. 7 is an exploded perspective view illustrating another internal structure of a laminated balun transformer according to the present invention.

The laminated balun transformer of the present invention having the above-described equivalent -circuit is implemented as shown in FIGS. 5 and 6.

FIG. 5 is a perspective view showing a shape of a laminated balun transformer according to the present invention.

Referring to FIG. 5, a laminated balun transformer 50 of the present invention is composed of a rectangular hexahedral dielectric block 51 formed by a plurality of dielectric sheets laminated by an LTCC method, and a plurality of external electrodes 52 to 57 formed on two opposite sides of the dielectric block 51, each of which is set for a ground connection, input/output of the unbalanced signal, input/output of the balanced signals, etc. Such a shape is the same as the conventional laminated balun transformer. Accordingly, since the laminated balun transformer of the present invention has the same shape as the conventional laminated balun transformer without an increase of the number of external electrodes or a modification of arrangement or structure, a user is convenient in the design and arrangement aspect of the laminated balun transformer. In this embodiment, the external electrode 52 is set for non-connection, the external electrodes 53 and 56 are set for a ground, the external electrodes 54 and 57 are set for input/output of the balanced signals, and the external electrode 55 is set for input/output of the unbalanced signal.

FIG. 6 is an exploded perspective view illustrating an internal structure of a laminated balun transformer according to the present invention, where shows the laminated structure represented by the equivalent circuit as shown in FIG. 4.

Referring to FIG. 6, for the laminated balun transformer of the present invention, conductive patterns are sequentially printed on the plurality of dielectric sheets implementing the dielectric block 51 in a direction from the top to the bottom of the figure.

First, a dielectric sheet with no conductive pattern formed thereon is arranged on a first layer, i.e., the uppermost layer, and a thirteenth layer, i.e., the lowermost layer.

Also, conductive patterns implementing the equivalent circuit of the FIG. 4 are laminated between the first layer and the thirteenth layer.

In more detail, the dielectric block 51 includes the first strip line 45 of a spiral or meandering shape having one end connected to the external electrode 52 for non-connection and the other end connected to the external electrode 55 of input/output of the unbalanced signal, the third strip line 47 of a spiral or meandering shape formed in parallel with the first strip line 45 on the top or the bottom of the first strip line 45, and having one end connected to the external electrode 56 for a ground and the other end connected to the external electrode 54 for input/output of a first balanced signal, the second strip line 46 of a spiral or meandering shape having one end connected to the external electrode 52 for non-connection and the other end opened, the fourth strip line 48 of a spiral or meandering shape having one end connected to the external electrode 56 for a ground and the other end connected to the external electrode 57 for input/output of a second balanced signal, and a capacitance forming electrode 60 formed in parallel with the other opened end of the second strip line 45 and having one end connected to the external electrode 55 for input/output of the unbalanced signal for forming a capacitance in parallel with the first and second strip lines 45 and 46. In this-case, a second ground electrode 61*b* for electrical shielding between two couplers, i.e., between the first and third strip lines 45 and 47 and the second and fourth strip lines 46 and 48, must be provided.

In addition, first and third ground electrodes 61*a* and 61*c* are further provided on the top and the bottom of the dielectric block 51, respectively.

In addition, a plurality of lead electrode 62*a* to 62*d* for connecting one ends of the first to fourth strip lines 45 to 48 to the corresponding external electrode 52 to 57 can be further provided on different layers. In this case, an electrical connection between the lead electrodes 62*a* to 62*d* and the first to fourth strip lines 45 to 48 can be implemented through via holes 63*a* to 63*d*.

When the first to fourth strip lines 45 to 48 are formed on the different layers, as described above, the size of the laminated balun transformer can be minimized. Alternatively, the first strip line 45 may be formed in parallel on the same plane as the second strip line 46, and the third and fourth strip lines 47 and 48 may be formed on different layers in parallel with the first and second strip lines 45 and 46. In this case, the second ground electrode 61*b* is not required. In addition, as long as the first strip line 45 is in parallel with the third strip line 47 and the second strip line 46 is in parallel with the fourth strip line 48, the shape and arrangement of the strip lines can be modified in various ways.

In addition, the capacitance forming electrode 60 is formed in parallel with the other opened end of the second strip line 46, or alternatively, may be formed on the top or the bottom of the second strip line 46, or may be formed in parallel on the same layer as the second strip line 46. In the embodiment as shown in FIG. 6, the capacitance forming electrode 60 may be formed on the same layer as the lead electrode 62*a* for connecting the second strip line 46 to the external electrode 52 for non-connection. In this way, it is most preferable that the capacitance forming electrode 60 is arranged such that separate processes are not added or its size is not increased.

For the laminated balun transformer 50 implemented as above, the first and third strip lines 45 and 47 and the second and fourth strip lines 46 and 48 act as a coupler, respectively. At this time, the second ground electrode 61*b* electrically shields between a coupler formed by the first and third strip lines 45 and 47 and a coupler formed by the second and fourth strip lines 46 and 48 to prevent an electromagnetic coupling therebetween. In addition, the first ground electrode 61*a* and the third ground electrode 61*c* causes the strip lines 45 to 48 to have a fixed impedance.

In addition, the capacitance forming electrode 60 forms a certain capacitance C determined by an area (length) of the electrode 60 facing the second strip line 46, a vertical distance therebetween, permittivity of dielectric sheets, etc., according to a electrical coupling effect. At this time, since one end of the capacitance forming electrode 60 is connected to the first strip line 45 through the external electrode 52 for non-connection, the capacitance C is electrically connected in parallel with the first strip line 45 and the second strip line 46.

Accordingly, the equivalent circuit as shown in FIG. 4 is formed to implement the LC resonator. In addition, since the third and fourth strip lines 47 and 48 are coupled to the first and second strip lines 45 and 46, respectively, the operation frequency of the laminated balun transformer is determined by the resonance frequency of the LC resonator. For example, when the operation of the laminated balun transformer is fc, the length of the first to fourth strip lines 45 to 48 is shorter than ¼ of a wavelength $\lambda$ (=1/fc) corresponding to the operation frequency fc. A degree of reduction of the length is in proportion to the size of the capacitance C formed between the capacitance forming electrode 60 and a partial region of the second strip line 46.

Operation of the laminated balun transformer 50 is as follows: For example, when the unbalanced signal having the operation frequency fc is applied to the external electrode 55 for input/output pf the unbalanced signal, a parallel resonance is generated by an inductance component by the strip lines 45 to 48 and a capacitance component by the capacitance forming electrode 60, and, at the same time, a coupling is generated between the first strip line 45 and the third strip line 47 and between the second strip line 46 and the fourth strip line 48. Accordingly, the balanced signals having the same magnitude and frequency and a phase difference of a degree of 180 from each other are outputted through the external electrodes 54 and 57 for input/output of the balanced signals connected to the ends of the third and fourth strip lines 47 and 48. Namely, an unbalanced signal corresponding to the operation frequency of the balun transformer 50 is transformed into a balanced signal and, on the contrary, a balanced signal corresponding to the operation frequency of the balun transformer 50 is transformed into an unbalanced signal.

As described above, according to the present invention, since the laminated balun transformer having an operation frequency is designed to have the length of four strip lines shorter than λ/4, the size of the laminated balun transformer can be further reduced. In addition, since a capacitance required to implement the LC resonator can be implemented by forming the capacitance forming electrode 60 having a size in an existing marginal space of a layer on which the lead electrode 62*a* is formed, such that the electrode 60 is in parallel with a partial region of the other opened end if the second strip line 46, a separate additional area or layer is not required.

As apparent from the above description, in implementing the laminated balun transformer of the present invention, a capacitance connected in parallel with the strip lines for implementing the LC resonator, without the increase of the number or area of layers to be laminated, can be formed. In addition, since the length of the strip lines can be reduced to be less than λ/4 in proportion to the size of the capacitance, a corresponding size reduction effect can be attained. Consequently, there is obtained an excellent effect of implementation of a subminiaturized laminated balun transformer, which could not obtained with the conventional structures and methods.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A laminated balun transformer including a dielectric block formed by laminating a plurality of dielectric sheets, and a plurality of external electrodes formed on outer sides of the dielectric block, the plurality of external electrodes being used for a ground, input/output of an unbalanced signal, input/output of first and second balanced signals, and non-connection, wherein the dielectric block comprises;

a first strip line having one end connected to the external electrode for input/output of the unbalanced signal;

a second strip line having one end connected to the other end of the first strip line, the other end of the second strip line being opened;

a third strip line formed in parallel with the first strip line, one end of the third strip line being connected to the external electrode for a ground and the other end of the third strip line being connected to the external electrode for input/output of the first balanced signal;

a fourth strip line formed in parallel with the second strip line, one end of the fourth strip line being connected to the external electrode for a ground and the other end of the fourth strip line being connected to the external electrode for input/output of the second balanced signal; and a capacitance forming electrode formed in parallel with a portion of the other opened end of the second strip line and having one end connected to the external electrode for input/output of the unbalanced signal for forming a capacitance in parallel with the first and second strip lines, wherein the first to fourth strip lines are formed on different planes, and wherein the dielectric block further comprises a ground electrode connected to the external electrode for a ground for forming an electrical shielding between the first and third strip lines and the second and fourth strip lines in parallel with each other.

2. The laminated balun transformer as set forth in claim 1, wherein the dielectric block further comprises a plurality of lead electrodes connected respectively to the external electrodes and formed on layers different from layers on which the first to fourth strip lines are formed, and via holes electrically connected to the first to fourth strip lines corresponding to the plurality of lead electrodes, and the first to fourth strip lines are connected to respective external electrodes through the plurality of lead electrodes.

3. The laminated balun transformer as set forth in claim 2, wherein the capacitance forming electrode is formed on the same plane as the lead electrode connected to the second strip line.

4. The laminated balun transformer as set forth in claim 1, wherein the capacitance forming electrode is formed on the same plane as the second strip line.

5. The laminated balun transformer as set forth in claim 1, wherein the capacitance forming electrode is formed on the top or the bottom of the second strip line.

6. The laminated balun transformer as set forth in claim 1, wherein ground electrodes connected to the external electrode for a ground for maintaining a uniform impedance characteristic in the first to fourth strip lines are formed on the uppermost and lowermost layers of the dielectric block, respectively.

7. The laminated balun transformer as set forth in claim 1, wherein each of the first to fourth strip lines has a spiral or meandering shape.

8. A laminated balun transformer including a dielectric block formed by laminating a plurality of dielectric sheets, and a plurality of external electrodes formed on outer sides of the dielectric block, the plurality of external electrodes being used for a ground, input/output of an unbalanced signal, input/output of first and second balanced signals, and non-connection, wherein the dielectric block comprises:

a first ground electrode having a rectangular shape and connected to the external electrode for a ground;

a first lead electrode having one end connected to the external electrode for non-connection and the other end at which a via hole for electrical connection with a lower layer is formed;

a capacitance forming electrode having a predetermined length formed on the same layer as the first lead electrode, and having one end connected to the external electrode for input/output of the unbalanced signal and the other end opened;

a second strip line formed below the first lead electrode and the capacitance forming electrode having one end at which a via hole is formed and the other end opened, a partial region of the other opened end being formed in parallel with the capacitance forming electrode;

a fourth strip line formed below the second strip line and having one end at which a via hole connected to a lower layer is formed and the other end connected to the external electrode for a ground, the other end being formed in parallel with the second strip line;

a second lead electrode having one end connected to the via hole of the fourth strip line and the other end connected to the external electrode for input/output of the balanced signals;

a second around electrode having a rectangular conductive pattern, formed below the second lead electrode, and connected to the external electrode for a ground;

a third lead electrode formed below the second ground electrode and having one end at which a via hole connected to a lower layer is formed and the other end connected to the external electrode for input/output of the balanced signals;

a third strip line having one end connected to the via hole of the third lead electrode and the other end connected to the external electrode for a ground;

a first strip line formed in parallel with the third strip line and having one end connected to the external electrode for input/output of the unbalanced signal and the other end at which a via hole connected to a lower layer is formed;

a fourth lead electrode having one end connected to the via hole of the first strip line and the other end connected to the external electrode for non-connection; and a third ground electrode having a rectangular shape formed below the fourth lead electrode and connected to the external electrode for a ground.

9. The laminated balun transformer as set forth in claim 8, wherein each of the first to fourth strip lines has a spiral or meandering shape.

* * * * *